Dec. 26, 1967 J. ZUCKER 3,360,725
SEMICONDUCTOR MICROWAVE POWER DETECTOR EMPLOYING THE BULK THERMOELECTRIC EFFECT
Filed April 27, 1964
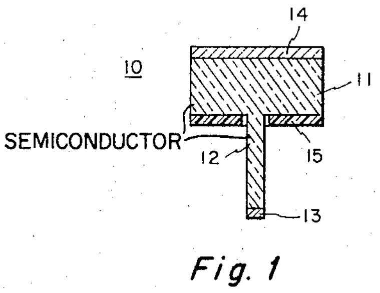
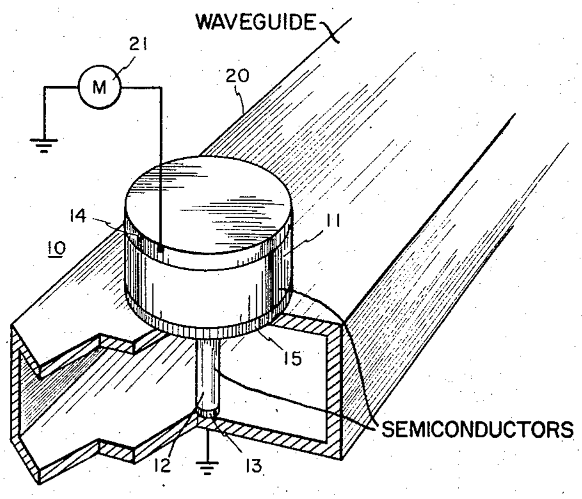
Fig. 2.
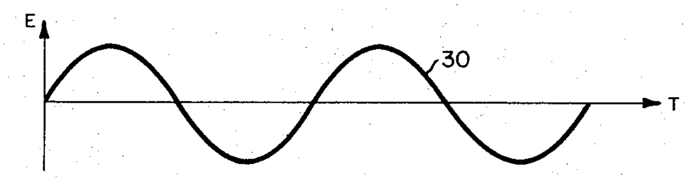
Fig. 3.
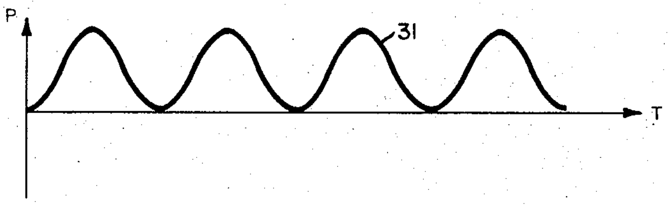
Fig. 4.
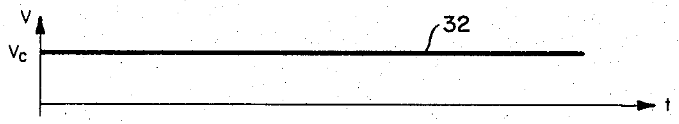
Fig. 5.
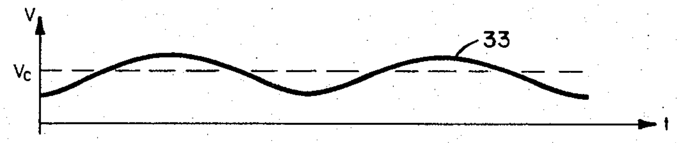
Fig. 6.
INVENTOR.
JOSEPH ZUCKER
BY R. J. Frank
ATTORNEY.

3,360,725

SEMICONDUCTOR MICROWAVE POWER DETECTOR EMPLOYING THE BULK THERMOELECTRIC EFFECT

Joseph Zucker, New York, N.Y., assignor to General Telephone and Electronics Laboratories, Inc., a corporation of Delaware Filed Apr. 27, 1964, Ser. No. 362,627
4 Claims. (Cl. 324—95)

ABSTRACT OF THE DISCLOSURE

A power detector is formed of a semiconductor bar characterized by a section of reduced area. The bar is provided with a contact at each end. In operation, the reduced area section is inserted into a waveguide and power is coupled therethrough to heat the carriers. The heated carriers diffuse to the section of the bar outside the waveguide and a voltage which is a function of the waveguide power is generated between the contacts.

This invention relates to apparatus for the detection of microwave power and more particularly to detectors utilizing the bulk thermoelectric effect of "hot carriers" in semiconductor material.

The increased use of higher frequencies for electromagnetic power transmission in recent years has created a great need for rugged, reliable power measuring devices capable of operation over a broad band of frequencies at both high and low power levels. In practice, power detectors inserted in a high frequency conductor or waveguide should exhibit a minimum variation in electrical impedance at different microwave frequencies and power levels to insure highly accurate measurements.

Power detection apparatus employing many types of semiconductor materials are known. However, these known devices are primarily junction-type semiconductor apparatus and do not rely on the bulk effect of semiconductor material. As a result, the devices are found to exhibit significant variations in electrical impedance when subjected to different high frequency powers. This variation is due in part to the field dependent capacitance exhibited by junction-type devices and results in the generally undesirable reduction of the frequency band in which measurements of high accuracy may be made. In addition, junction-type devices are generally more temperature sensitive than bulk effect semiconductor devices and their impedance varies significantly with changes in environmental conditions.

The present invention is directed to the provision of a novel microwave power detector capable of detecting the level of electromagnetic power in a waveguide and/or the level of amplitude modulation thereof with a high degree of accuracy. Also, the invention can be operated as a mixer of microwave signals if so desired.

This invention utilizes the bulk thermoelectric effect of "hot carriers" in semiconductor material to provide an output signal which is either an indication of the power level of the microwave signal or the amplitude modulation thereon as desired for a particular application. As known in the art, the bulk thermoelectric effect of semiconductor material generates an electromotive force as a result of the preferential diffusion of "hot carriers" therein and is independent of inhomogeneities such as junctions or energy barriers. By employing a bulk semiconductor effect, the apparatus is found to be more rugged than junction-type detectors and less susceptible to burn out due to high overload powers.

In addition, the present apparatus is found to be less subject to ambient or environmental changes than known devices performing similar operations. The invention is substantially a dissipative element having only the field-independent lattice capacitance inherent in semiconductor materials, thereby permitting accurate measurements to be made over a wide power and frequency range. A further advantage is that the need for a cartridge or specially adapted waveguide mount necessary in previously known devices performing similar operations is obviated by the unique construction of the invention.

In accordance with the present invention a cylindrical bar of semiconductor material is formed to have an end portion of reduced cross-sectional area. The smaller area portion of the bar is then inserted into the waveguide at a point of high electric field intensity with the corresponding larger area portion remaining outside the waveguide at a point of relatively low electric field intensity.

An ohmic metal contact is affixed to the small area portion of the bar and contacts the waveguide wall to thereby couple the power in the waveguide through the contact into the inserted portion of the semiconductor bar. This small area contact is selected or treated so that when contacting the wafer no Schottky barrier or p-n junction is established therebetween, thus permitting the detector to effectively utilize the bulk effect of the semiconductor bar.

The microwave power coupled into the small area portion of the bar is absorbed by the majority carriers residing therein. As the power density is quite high in the reduced portion of the semiconductor bar, the rate at which energy is absorbed by the majority carriers exceeds the rate at which the carriers can dissipate this energy and therefore the average energy or temperature of the carriers rises.

The carriers in the region of high power density diffuse preferentially toward a region of lower power density where the carriers have a lower average energy. The resultant change in charge distribution due to "hot carrier" movement generates a thermoelectric voltage between the ohmic contact of the small area portion and a low resistance contact mounted on the portion of the semiconductor bar remaining outside the waveguide. This voltage is a function of the electromagnetic power in the conductor and may be readily supplied to an external indicator.

Further features and advantages of the invention will become more readily apparent from the following description of a specific embodiment as shown in the accompanying drawings, in which:

FIG. 1 is a cross-section of one embodiment of the invention;

FIG. 2 is a perspective of the embodiment shown in FIG. 1 with the waveguide broken away; and FIGS. 3–6 show the various waveforms associated with this embodiment of the invention.

Referring more particularly to FIG. 1, cylindrical semiconductor bar 10 is shown comprising first and second sections 11 and 12 of unequal cross-sectional areas. Cylinder or bar 10 is formed of a single crystal semiconductor material such as germanium, silicon or the like. The semiconductor material is preferably lightly-doped by the addition of impurities to make either a p-type or n-type extrinsic semiconductor bar. As is known in the art, impurities from Group III of the Periodic Table will provide a p-type cylinder while those of Group V provide an n-type cylinder. However intrinsic semiconductor material may be employed if desired.

The majority carriers of the semiconductor cylinder become "hot carriers" when the average energy of the carriers exceeds the energy of the associated lattice. Depending on the majority carrier of the intrinsic semiconductor material employed or the type of doping used, these carriers may be either "hot holes" or "hot electrons."

The carrier concentration of cylinder 10 is selected to be less than $10^{16}$ carriers per cubic centimeter at room temperatures. This relatively light doping level is chosen to insure that each carrier will absorb a significant portion of the electromagnetic power applied to a unit volume of semiconductor.

Ohmic contact 13 is shown mounted at the end of second section 12 of the semiconductor cylinder. The contact 13 is a metal contact selected or treated such that no Schottky barrier or p-n junction is formed with the semiconductor cylinder. Therefore, contact 13 forms what is commonly referred to as a non-injecting contact.

The opposing end of cylinder 10 is shown having metallic contact 14. This contact is of substantially greater area than that of contact 13 and preferably is also an ohmic contact. However, as will be pointed out later in the specification, metallic contact 14 is positioned in a region of generally low power density and any contact exhibiting a low electrical impedance at the frequencies of interest may be employed.

The electrical impedance of the invention is seen from the above discussion to be the sum of the linear impedances of the contacts and the impedance of the bulk semiconductor bar. By eliminating the need for a barrier or junction, the device acts as a dissipative element of substantially constant impedance. Although lattice capacitance is inherent in semiconductor material, it is a field-independent capacitance and remains substantially constant thereby permitting measurements to be made over a wide frequency band and power range.

Insulating washer 15, formed of Mylar or the like, is shown mounted on the side of first section 11 adjacent second section 12 of cylinder 10 and having an outside diameter substantially equal to the diameter of first section 11. In the event that the large cross-section of first section 11 is noncircular, insulating washer 15 should be chosen to contact substantially the entire area thereof.

Insulating washer 15 acts as a low frequency insulator while providing capacitive coupling at microwave frequencies between the adjacent wall of waveguide 20 and first section 11 of semiconductor bar 10. This coupling is located at the opposite end of first section 11 from contact 14 to insure that contact 14 is mounted in a region of relatively low power density. To prevent arcing at high microwave power levels, the coupling area of first section 11 is selected to be large. However, for operation at low power levels the diameter of section 11 may be made substantially equivalent to that of second section 12.

As shown in FIG. 2, semiconductor bar 10 is positioned on the broad wall of waveguide 20 so that second section 12 of reduced cross-section is inserted into and is substantially parallel to the narrow dimension of the waveguide. The length of second section 12 is made sufficient to extend across the waveguide 20 to insure that ohmic contact 13 is in electrical contact with the waveguide wall when insulating washer 15 engages the outer surface of the opposing waveguide wall. It is to be noted that the corresponding hole in waveguide 20 is made large to insure that second section 12 does not contact the wall when inserted therein.

Thus, ohmic contact 13 is positioned to couple electromagnetic power traveling in the fundamental transverse electric or TE mode in waveguide 20 to second section 12 of semiconductor bar 10. To insure proper location of contact 13 in the waveguide, an external tuning circuit may be used to maximize the electric field at the point of contact. This may be accomplished through the use of tuners, open or short circuits as well known in the electrical art.

If the diameter of second section 12 and corresponding ohmic contact 13 is a small fraction, such as $\frac{1}{15}$ of the wavelength of the microwave power, it is then possible to tune the waveguide so that the electric field is maximized at contact 13 by the above-mentioned methods.

During normal operation, power in the waveguide is coupled through contact 13 into second semiconductor section 12. The majority carriers therein, either holes or electrons, will absorb power and experience a sharp increase in average energy. If the semiconductor carrier concentration is light, for example less than $10^{16}$ carriers per cubic centimeter, each carrier in section 12 will accordingly absorb a significant portion of the coupled power.

As stated previously, a portion of the electromagnetic power propagating in the waveguide is coupled to second section 12 and flows through it into first section 11. The electrical path for this high frequency power is then completed through the capacitive coupling existing at microwave frequencies between first section 11 and the adjacent wall of the waveguide 20. Since the area of first section 11, forming essentially one plate of a capacitor, is greater than the area of second section 12, the power density is substantially less and the carriers residing therein absorb a relatively small amount of power. The carriers of first section 11 proximate contact 14 are found to experience no measurable increase in average energy and as a result are maintained essentially in thermal equilibrium with the semiconductor lattice.

The lattice temperature is found to be substantially constant throughout semiconductor bar 10 so that a carrier temperature gradient exists within the bar due to the absorption of energy by those carriers in section 12. This temperature gradient and uneven heating of the carriers result in a diffusion of the more energetic carriers in the region of high power density to regions of low power density, and in this embodiment to first section 11 outside waveguide 20.

The redistribution or diffusion of the carriers serves to generate a thermoelectric voltage between contacts 13 and 14 which is a function of the electromagnetic power coupled into reduced area section 12 through contact 13.

Referring now to the waveforms of FIGS. 3–6, waveform 30 shows the high frequency electric field existing at contact 13 in waveguide 20, while waveform 31 indicates the power density in second section 12 for an unmodulated microwave carrier. It is to be noted that as the power density is proportional to the square of the electric field it will have a positive although varying magnitude throughout an entire period.

Initially, the rate at which power is absorbed by the carriers residing in second section 12 exceeds the rate at which these carriers can transfer this additional energy to the semiconductor lattice. The average energy of the carriers rises until a new equilibrium condition is reached with the lattice. This equilibrium condition is characterized by a heating of the carriers.

By utilizing a semiconductor material with the aforementioned carrier concentration, the carriers are found to have an energy relaxation time in the order of $10^{-11}$ second. This time constant is a measure of the time required for the carriers to achieve an equilibrium condition at the new temperature. Also, electromagnetic power density having a frequency greater than the reciprocal of the carrier energy relaxation time will raise the carrier to a substantially constant new temperature level. This is due to the inability of the carriers to absorb and release energy as fast as the periodic high frequency power density in the wafer varies.

The semiconductor material of bar 10 has a dielectric relaxation time which is related to the time required for the generation of a thermoelectric voltage by carriers experiencing a given change in carrier temperature. This quantity is found to be the product of the D-C resistivity of the semiconductor material and the dielectric constant and has a value which may be an order of magnitude smaller than the carrier energy relaxation time. Therefore electromagnetic power density having a frequency greater than either of the reciprocals of the carrier energy relaxation time and the dielectric relaxation time will generate a D-C thermoelectric output voltage $V_c$ as shown by the waveform 32 of FIG. 5.

However, for electromagnetic power density having a frequency less than both the reciprocal of the carrier relaxation time and the reciprocal of the dielectric relaxation time, the thermoelectric voltage generated by the diffusion of the carriers varies periodically in substantial correspondence with the power density waveform.

As shown by waveform 33 of FIG. 6, the invention may be readily employed to demodulate amplitude modulated microwave signals. The frequency of the modulation signal will of course be significantly less than that of the high frequency carrier and therefore will be less than the reciprocals of the carrier energy and dielectric relaxation times. Thus the carrier diffusion is able to follow the variation in power density in section 12 from the application of a modulated carrier signal. This is illustrated by waveform 33 showing the varying thermoelectric output voltage corresponding to a modulated microwave carrier.

The thermoelectric voltage generated between the contacts may be supplied to external indicating means such as D.C. voltmeter, as seen in FIG. 1 wherein a single-ended output is shown connected to indicating means 21. Alternatively, indicating means such as an oscilloscope, responsive to the varying component of the thermoelectric output voltage may be employed to provide an indication of the amplitude modulation on the microwave signal. Also, the output voltage may be supplied to either an audio or video amplifier depending on the type of modulation employed.

In addition, the invention may be employed in a waveguide as a mixer of microwave signals therein whose difference frequency is less than the reciprocals of the carrier energy relaxation time and the dielectric relaxation time. The thermoelectric voltage generated will then have a frequency equivalent to this difference frequency.

The sensitivity of the invention is dependent on the amount of power received per unit carrier and therefore is determined primarily by the majority carrier concentration and the cross-sectional area of the inserted second section of the semiconductor bar. In one particular embodiment made of n-type germanium with arsenic doping and tested and operated at a frequency of 2.85 gigacycles, the diameter of the first section was 200 mils, the diameter of the inserted section 10 mils and the carrier concentration substantially $10^{14}$ carriers per cubic centimeter. The embodiment used in conjunction with a D-C voltmeter was found to detect signal levels as low as $10^{-3}$ watts while being able to operate at peak power levels in the hundreds of kilowatts range.

The output voltage generated is in the range of 1 to 5 millivolts for input power densities of 1 kilowatt per cubic centimeter depending on the type of semiconductor material employed and its carrier concentration. The accuracy of the device when calibrated is found to be determined essentially only by the accuracy of the indicating means employed.

While the above discussion has described a single embodiment of the invention, it is understood that many modifications may be made therein without departing from the spirit and scope of the invention.

What is claimed is:

1. A device for detecting microwave power in a waveguide, said waveguide having an opening in a wall thereof for receiving said device, which comprises:

(a) a bar of semiconductor materials having a carrier concentration of not more than $10^{16}$ carriers per cubic centimeter and comprising first and second sections, said second section having a reduced area for insertion through the opening in said waveguide wall;

(b) an ohmic contact mounted on the end of said second section and contacting the opposite wall, said contact providing microwave power coupling therethrough;

(c) capacitive coupling means mounted on the side of said first section adjacent said second section for providing coupling at microwave frequencies between the first section of said bar and the adjacent waveguide wall;

(d) a metallic contact mounted on the first section of said bar, the microwave power coupled through said bar heating the carriers within said second section whereby a voltage which is a function of the microwave power in the waveguide is generated between said ohmic and metallic contacts, and (e) means for coupling said ohmic and metallic contacts to an external indicating means for utilizing the voltage generated therebetween.

2. The device of claim 1 in which said metallic contact is an ohmic contact.

3. The device of claim 2 in which said second section has a cross-sectional area that is substantially less than that of said first section.

4. The device of claim 3 in which said second section has a cross-sectional area of about $\frac{1}{400}$ that of said first section.

References Cited

UNITED STATES PATENTS

| | | | |
|---|---|---|---|
| 2,974,223 | 3/1961 | Langberg | 328—20 X |
| 3,001,134 | 9/1961 | Conwell | 324—95 |
| 3,001,135 | 9/1961 | Many | 324—95 |

OTHER REFERENCES

Basic Course in Semiconductors and Technology, Dr. E. H. Borneman, MB–1963, Semiconductor Div., Westinghouse Electric Corp., Youngwood, Pa.

RUDOLPH V. ROLINEC, *Primary Examiner.*

E. F. KARISEN, J. J. MULROONEY, *Examiners.*